June 28, 1960 A. A. HEMPHILL ET AL 2,943,249

REMOTE TUNING SERVOSYSTEM FOR RADIO RECEIVERS

Filed March 26, 1957 4 Sheets-Sheet 1

ALFRED A. HEMPHILL
JOHN M. TEWKSBURY
*INVENTORS*

*BY*

Killman and Kerst
ATTORNEYS

ALFRED A. HEMPHILL
JOHN M. TEWKSBURY
*INVENTORS*

BY

Killman and Kerst
ATTORNEYS

TOTAL RESISTANCE OF RC = 1000 OHMS

| FREQUENCY RANGE | R1 | R2 |
|---|---|---|
| 100 - 200 | 0 | 0 |
| 200 - 300 | 1000 | 0 |
| 300 - 400 | 0 | 1000 |
| 400 - 500 | 3000 | 0 |
| 500 - 600 | 2000 | 1000 |
| 600 - 700 | 1000 | 2000 |
| 700 - 800 | 0 | 3000 |
| 800 - 900 | 7000 | 0 |
| 900 - 1000 | 6000 | 1000 |
| 1000 - 1100 | 5000 | 2000 |
| 1100 - 1200 | 4000 | 3000 |
| 1200 - 1300 | 3000 | 4000 |
| 1300 - 1400 | 2000 | 5000 |
| 1400 - 1500 | 1000 | 6000 |
| 1500 - 1600 | 0 | 7000 |

ALFRED A. HEMPHILL
JOHN M. TEWKSBURY
*INVENTORS*

*BY*

Killman and Kurst
ATTORNEYS

ALFRED A. HEMPHILL
JOHN M. TEWKSBURY
*INVENTORS*

*BY*

Killman and Kerst
ATTORNEYS

Patented June 28, 1960

2,943,249

REMOTE TUNING SERVOSYSTEM FOR RADIO RECEIVERS

Alfred Amos Hemphill and John Merle Tewksbury, Baltimore, Md., assignors to Bendix Aviation Corporation, Towson, Md., a corporation of Delaware Filed Mar. 26, 1957, Ser. No. 648,640

6 Claims. (Cl. 318—29)

This invention relates to electrical systems for remotely tuning radio receivers. In radio receivers which have a wide frequency coverage, it becomes necessary to divide the total frequency range into bands for tuning purposes. These bands will usually have a width such that the highest frequency of each band will be twice the lowest frequency. This ratio is selected because it gives a convenient bandwidth at lower frequencies. The movement of a tuning element such as condenser rotor or inductive tuning slug which will span such a frequency ratio in one part of the frequency spectrum of the receiver will do likewise in all parts of the spectrum.

Tuning is normally affected by the rotation of a shaft between limits. It is desirable that the same tuning shaft be utilized for tuning the frequency range of each band with some means for selecting the desired band. The use of a tuning shaft in connection with frequency bands which change their widths through the frequency spectrum has certain drawbacks. Since a given angular rotation of the shaft will cover a different frequency increment in each band, a different scale must be used for each band. The sensitivity and accuracy with which tuning may be achieved, decreases from the lower end of the spectrum to the higher. Furthermore, it does not lend itself to a common decade frequency indicated for all bands such as the use of digital windows.

Means have been devised by which the frequency spectrum of the receiver is divided into bands of equal range and by means of which a shaft in the control station is moved by the same angular amount for a given frequency change in any band. The movement of the shaft is communicated to the tuning shaft at the receiver by a mechanical transmission which multiplies it as a function of the location, in the frequency spectrum, of the band being used. Such mechanical transmission systems are, however, complicated and expensive and, in aircraft installations, add unwanted weight and bulk.

It is desirable to provide some simple and effective means for the remote tuning of such a receiver in which a given angular movement of a shaft in the control station will cause the receiver to be tuned over the same frequency increment, regardless of the band which has been selected.

It is, accordingly, an object of the invention to provide such a system in which angular movement of the control station shaft begins and ends at the same limits for equal frequency increments of a selected magnitude, regardless of the location of the increment within the frequency spectrum of the receiver.

It is a further object of the invention to provide a remote tuning means in which a given angular movement of a shaft in a control station will cause a receiver to be tuned through the same frequency increment in any selected frequency band covered by the receiver.

It is a further object of the invention to provide such a system which is simple and inexpensive, and adds a minimum of bulk and weight to the installation.

These, and other objects and advantages of the invention are realized in an electrical tuning system which incorporates a bridge circuit with a servo motor control means simultaneously actuating a tuning shaft and a potentiometer at the receiver to balance the bridge in response to an error signal established by the unbalancing of the bridge at the control station caused by the actuation of a tuning potentiometer in that location. In order to achieve the desired results, the potentiometer at the control station is provided with a serial arrangement of resistors of such value as to cause the impedance change due to complete traverse of the tuning potentiometer to be equal to that caused by the complete traverse of the potentiometer at the receiver over that portion of its total range of movement required for full coverage of the selected frequency band. Various combinations of resistors are switched into the tuning end of the bridge simultaneously with the selection of the various frequency bands.

Figure 1:
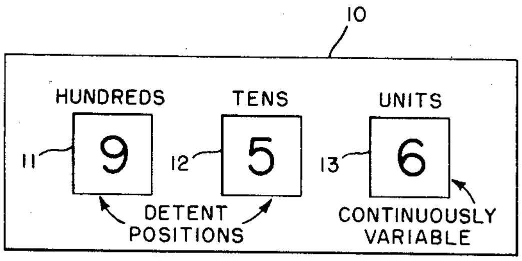
Fig. 1 is a schematic representation of a control panel frequency indication.

Referring now more particularly to the drawing, there is shown in Fig. 1 a representation of a decade type of frequency indication which it is desired to be able to utilize in connection with the remote tuning of a receiver having a broad frequency coverage. In this figure, there is shown a box 10 representing a control panel having three windows 11, 12, and 13. The window 11 indicates the hundreds digit, 12 the tens digit, and 13 the units digit of a selected frequency. In utilizing this type of display the hundreds digit would be selected by any conventional type of band selection means, the operation of which, would, in a conventional manner, bring the proper hundreds digit before the window 11. Thus, frequency bands of 100 kc. would be utilized. Tuning within each hundred kc. range would be effected by the rotation of a control shaft. It can be seen that, in order to be able to utilize such an indicating system, it is necessary that a given angular movement of the control shaft cause the receiver to be tuned over the same frequency increment, no matter which band has been selected.

Figure 2:
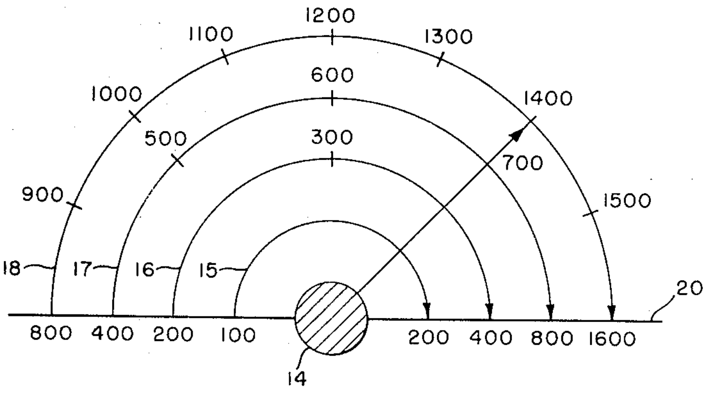
Fig. 2 is a graph showing frequency scale representations for a conventional multi-band tuning arrangement.

Fig. 2 indicates the tuning action of a tuning shaft, the rotation of which causes a movement proportional thereto in a rotor of a tuning capacitor or the slug of an inductive tuning means. There is shown a cross-sectional view of a tuning shaft 14. Surrounding the upper portion of this shaft are a plurality of semi-circular scale lines 15, 16, 17, and 18. As is apparent from the indications on the base line 20, common to these indications, the line 15 represents the tuning range from 100 to 200 kc. The line 16 represents the tuning range from 200 to 400 kc. Line 17 represents the tuning range from 400 to 800 kc., and line 18 the tuning range from 800 to 1600.

It is apparent that with a conventional mechanical linkage between this shaft and a remotely located tuning shaft or knob a frequency indication of the type shown in Fig. 1 could only be used for the band from 100 to 200 kc. In the next band the tuning shaft would move only 90° in covering a 100 kc. frequency change instead of 180°. Furthermore, the starting point for the 200 kc. band and the 300 kc. band would be different as would the finishing points. It is apparent that, as the bands move upward in frequency, the amount of shaft rotation for a given frequency change will decrease and the starting points for the 100 kc. bands will change.

Figure 3:
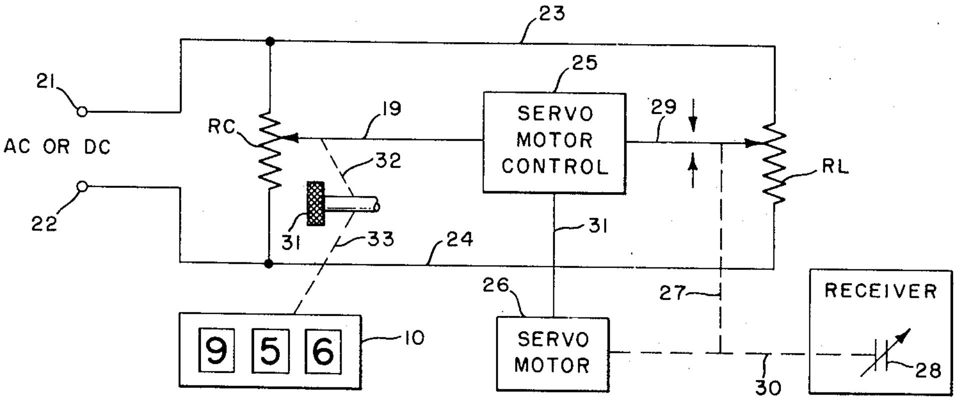
Fig. 3 is a schematic diagram of a bridge circuit with a servo motor control for balancing the bridge.

In accordance with the invention, the difficulties associated with mechanical tuning arrangements are resolved by the use of an electrical resistance bridge type of circuit which will now be described. Fig. 3 shows a form of such a circuit which could be used in tuning a single frequency band. In the control station is located a tuning potentiometer RC. At the receiver is a potentiometer RL. An A.C. or D.C. voltage is supplied from terminals 21 and 22 through conductors 23 and 24 which connect the two potentiometers in parallel. The slider of the potentiometer RC is electrically connected by a lead 19 to a conventional servo motor control means indicated by the box 25 which controls a servo motor 26 through a connnection 31. The latter, in turn, drives the slider of the potentiometer RL by means of a mechanical linkage indicated by the dashed line 27. This slider is connected to the servo motor control means 25 by a lead 29 to provide follow-up voltage thereto. The servo motor also drives a tuning element indicated as a variable capacitor 28 by mechanical linkage indicated by the dashed line 30. The slider of the potentiometer RC is manually driven by means of a control shaft 31 which also drives the tens and units digits of a conventional counter to form the display 10. The drive between the shaft 31 and the slider of the potentiometer RC is indicated by the dashed line 32 and the drive for the counter by the dashed line 33.

It is apparent that the circuit of Fig. 3 would operate only over a single frequency band. However, the total resistances of the two potentiometers do not have to be equal. Even if their resistances are different, adjustment of the potentiometer RC, through its full range, will cause the potentiometer RL to be swept throughout its full range, whether the resistances of the two be the same or different.

Figure 4:
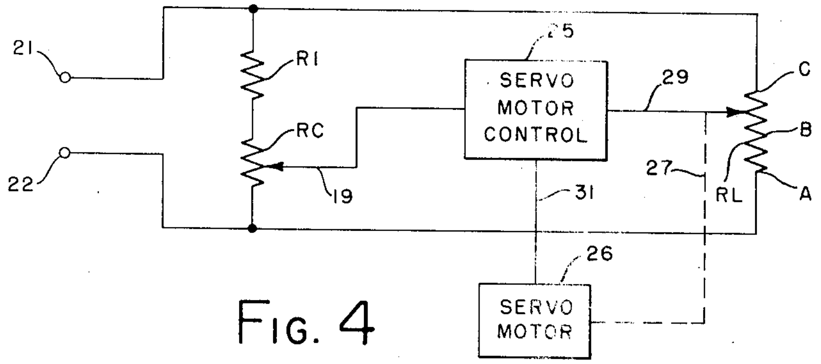
Fig. 4 is a schematic diagram of a modification of the circuit of Fig. 3.

Fig. 4 shows a variation of the bridge circuit of Fig. 3, in accordance with the invention, in that another resistor R1 has been added in parallel with the potentiometer RC. If the value of the resistance R1 is the same as that of RC, movement of the slider across the full range of RC will cause the slider of the potentiometer RL to move between A and B. If R1 and RC were interchanged the slider of RL would move between B and C for a full traverse of potentiometer RC.

Figure 5:
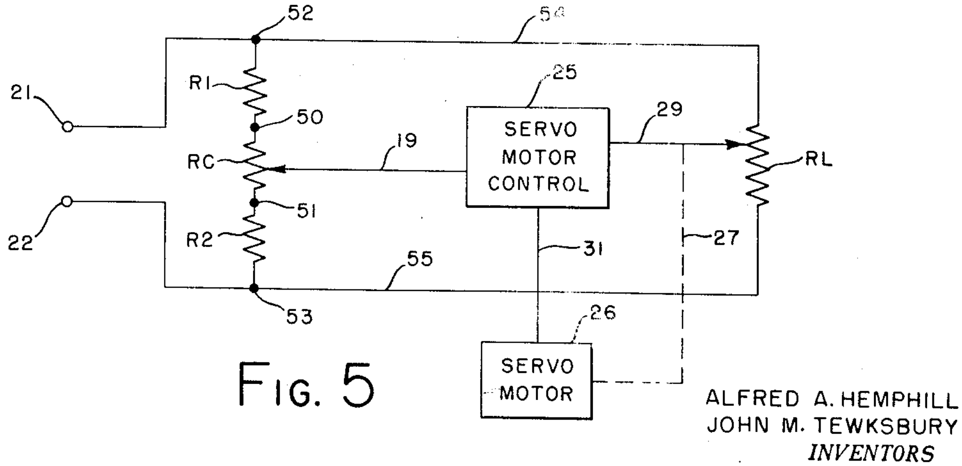
Fig. 5 is a schematic diagram showing the circuit of Fig. 3 improved in accordance with the invention.

Fig. 5 shows a further variation of the circuit of the Fig. 4 in accordance with the invention in a manner such that a complete traverse of the potentiometer RC may be made by the proper selection of the values of resistors R1 and R2 to cause the tuning element 28 to tune through any desired one of the hundred kc. frequency bands.

Figures 6, 8:
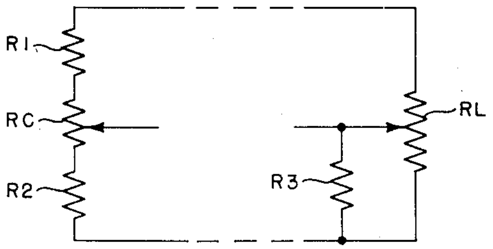
Fig. 6 is a graph showing a table of resistor values to be utilized in a circuit of the type shown in Fig. 5.

Fig. 6 shows a table of frequency values for R1 and R2 to establish the above condition for each of the hundred kc. frequency bands from 100 to 1500 kc. This table assumes that the value of RC is 1000 ohms. By the use of this arrangement of resistor values, it is evident that movement of the shaft 31 through its full tuning range and the accompanying movement of the slider of RC throughout its full range will cause the tuning shaft 30, at the receiver, to be turned by the appropriate angle as indicated in Fig. 2 for the various frequency subdivisions.

Figure 7:
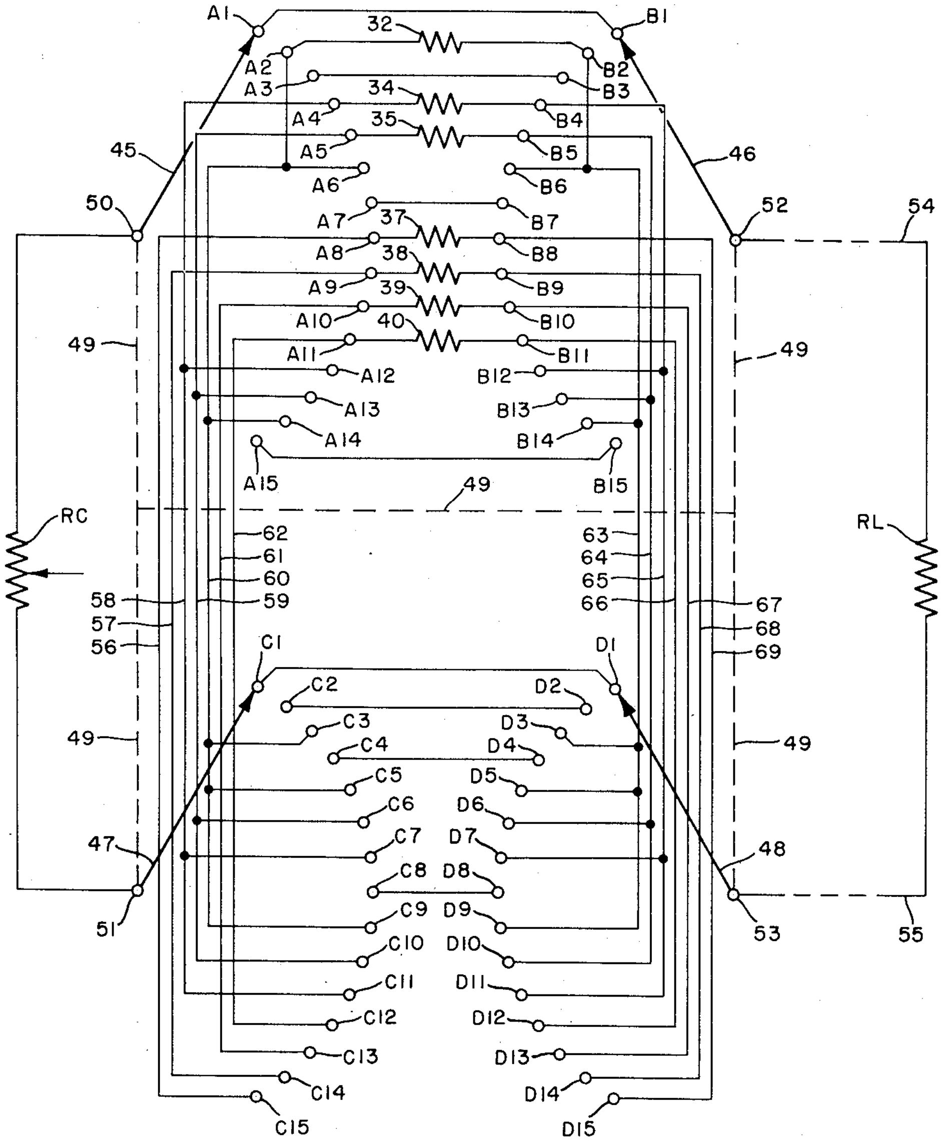
Fig. 7 is a schematic diagram of a circuit for switching, into a circuit of the type shown in Fig. 5, the various resistor combinations set forth in Fig. 6; and, Fig. 8 is a schematic diagram of a fragment of the circuit of Fig. 5, with an added resistor.

Fig. 7 illustrates a switching system by which the various combinations of resistors shown in Fig. 6 may be switched into place in the bridge circuit.

For convenience in following the switching diagram of Fig. 7, the terminals of resistor RC have been numbered 50 and 51. The remaining terminal of resistor R1 has been numbered 52 and the remaining terminal of resistor R2 has been numbered 53. Terminal 52 is connected to RL by conductor 54 and terminal 53 is connected to the remaining terminal of RL by conductor 55. In the system of Fig. 7 a conductive switch arm 45 is connected from the terminal 50 to a plurality of switch contacts designated A1 through A15. The terminal 52 is connected by a conductive switch arm 46 to a similar series of switch contacts designated B1 through B15. The terminal 51 is connected by conductor switch arm 47 to a plurality of contacts C1 through C15. The terminal 53 is connected by a switch arm 48 to a series of contacts D1 through D15. The switch arms are ganged by means indicated by the dotted lines 49. Between the contacts A1 and B1, A3 and B3, A7 and B7, A15 and B15, C1 and D1, C2 and D2, C4 and D4 and C8 and D8 are short-circuiting connections. A 1,000 ohm resistor 32 spans the contacts A2 and B2. The contacts A4 and B4 are spanned by a 3,000 ohm resistor 34. A 2,000 ohm resistor 35 is connected between A5 and B5. A 7,000 ohm resistor 37 is connected between A8 and B8. A 6,000 ohm resistor 38 connects A9 and B9. A 5,000 ohm resistor 39 spans A10 and B10 and the contacts A11 and B11 are joined by a 4,000 ohm resistor 40.

Contacts A2, A6 and A14 are joined to contacts C3, C5 and C9 by conductor 60. A conductor 61 joins A10 and C13. A11 is joined to C12 by conductor 62. A5 and A13 are connected to C6 and C10 by conductor 59. Conductor 58 joins A4, A12, C7 and C11. A9 is joined to C14 by conductor 57. A8 is joined by conductor 56 to C15.

Conductor 63 connnects B2, B6, B14, D3, D5 and D9. Conductor 64 joins B5, B13, D6 and D10. Conductor 65 connects B4, B12, D7 and D11. B11 is connected by conductor 66 to D12. Conductor 67 connnects B10 and D13. B9 is connected by conductor 68 to D14. Conductor 69 connects B8 and D15.

In the operation of the switching system of Fig. 7, the switch arms are shown in contact with the contact elements A1, B1, C1, and D1. These correspond to the frequency range of 100 to 200 kc. shown in the top line of the diagram of Fig. 6. By moving the switch arms to contact with the contact elements A2, B2, C2 and D2, the system is set-up for the frequency band of 200 to 300 kc., as indicated in Fig. 6, with the terminals 50 and 52 joined by the 1,000 ohm resistor 32 and the terminals 51 and 53 short-circuited. This is the arrangement of resistors indicated for R1 and R2 in the second line from the top of Fig. 6. By progressively shifting the switch arms downwardly through the series of contact elements, the arrangements of resistors indicated in Fig. 6 for the remainder of the frequency bands will be successfully switched into this system.

It will be noted that fifteen different arrangements are provided for with a total of only seven resistors.

The control can be linear, as in the forms of the invention described above, so that there is a selectable constant ratio between the rotation of the control potentiometer and the controlled shaft. However, non-linear control can be obtained by using non-linear windings on the potentiometers, by connecting a resistor R3 from the arm to one leg of the potentiometer RL as shown in Fig. 8 or by any of the many ways which will be apparent to those skilled in the art.

What is claimed is:

1. Means for causing rotation of a first shaft through a selected angle to effect rotation of a second remotely located shaft through a second angle proportionally related to said selected angle, comprising a first potentiometer, means moving the slider of said potentiometer in accordance with the angular movement of said first shaft, a second potentiometer, at least one resistor serially connected to said first potentiometer, means connecting the free terminal of said one resistor to one terminal of said second potentiometer, means connecting the free terminal of said first potentiometer to the remaining terminal of said second potentiometer, a servo motor driving the slider of said second potentiometer and said second shaft in unison, means establishing a potential across said first potentiometer, means generating and applying to said servo motor a control voltage which varies in magnitude and polarity in accordance with the magnitude and polarity of the potential difference between said sliders, the value of said resistor bearing the same proportionality to the sum of the values of said resistor and said first potentiometer as said second angle bears to said selected angle.

2. Means for causing rotation of a first shaft through a selected angle to effect rotation of a second remotely located shaft through a second angle smaller than said selected angle, comprising a first potentiometer, means moving the slider of said potentiometer in accordance with the angular movement of said first shaft, a second potentiometer, at least one resistor serially connected to said first potentiometer, means connecting the free terminal of said one resistor to one terminal of said second potentiometer, means connecting the free terminal of said first potentiometer to the remaining terminal of said second potentiometer, a servo motor driving the slider of said second potentiometer and said second shaft in unison, means establishing a potential across said first potentiometer, means generating and applying to said servo motor a control voltage which varies in magnitude and polarity in accordance with the magnitude and polarity of the potential difference between said sliders, the value of said resistor bearing the same proportionality to the sum of the values of said resistor and said first potentiometer as said second angle bears to said selected angle.

3. A system for causing rotation of a first shaft to effect rotation of a second remotely located shaft, comprising a first potentiometer, means moving the slider of said potentiometer in accordance with the angular movement of said first shaft, a plurality of resistors of different values, a second potentiometer, switch means connecting one of said resistors to each terminal of said first potentiometer and the free terminals of said resistors to a respective terminal of said second potentiometer, a servo motor driving the slider of said second potentiometer and said second shaft in unison, means applying a potential across said first potentiometer and said resistors in series, means generating and applying to said servo motor a control voltage which varies in magnitude and polarity in accordance with the magnitude and polarity of the potential difference between said sliders, and means for varying the travel of said second shaft in response to a complete traverse of said first potentiometer by the slider thereof, the last named means including said switch means for selectively inserting resistors from said plurality in series with said first potentiometer.

4. A band-switch, band-tuning means for varying the movement of a tuning element of a radio receiver in response to movement of a tuning shaft in a remote location comprising: a second shaft at said receiver, means mounting said tuning element for movement proportional to the movement of said second shaft, a first potentiometer in said remote location having a slider driven by said tuning shaft, means for connecting resistance in series with said first potentiometer, a second potentiometer having a slider at said receiver, a servo motor driving the slider of said second potentiometer and said second shaft in unison, means for applying a potential across said first potentiometer and said resistance in series, means including said resistance in series conductively connecting end terminals of said first potentiometer to a respective terminal of said second potentiometer, means generating and applying to said servo motor a control voltage which varies in magnitude and polarity in accordance with the magnitude and polarity of the potential difference between said sliders, and means for varying the relative positions of said sliders for which said potential difference is reduced to zero, comprising means for selectively altering said resistance in series with said first potentiometer in sets of values on each side of said first potentiometer corresponding to said band-switch settings.

5. Apparatus according to claim 4 in which a fixed resistor is connected between the wiper and one end terminal of said second potentiometer for altering the relation between movement of said sliders.

6. A band-switch, band-tuning apparatus comprising a band-tuning control, a first potentiometer having a slider movable with said control, a tuning element, a second potentiometer having a slider movable with said tuning element, a plurality of resistors of progressively different values, a selector switch for serially connecting a selected pair of said resistors to the respective end terminals of said first potentiometer, the resistance values so connected successively increasing on one end of said first potentiometer and decreasing on the other end for each octave tuned by said apparatus, means for applying supply voltage to the free ends of said selected pair of resistors, a circuit connecting the free ends of said selected pair of resistors to the respective end terminals of said second potentiometer, a servo motor for driving the slider of said second potentiometer and said tuning element in unison, and means for generating and applying to said servo motor a control voltage derived from the potential between said sliders which operates said servo motor to reduce said potential to zero.

References Cited in the file of this patent

UNITED STATES PATENTS

| | | |
|---|---|---|
| 2,536,850 | Kutzler | Jan. 2, 1951 |
| 2,679,621 | Houck | May 25, 1954 |